United States Patent [19]

Zlotek

[11] Patent Number: 4,878,570
[45] Date of Patent: Nov. 7, 1989

[54] SURFACE HARDENED SPRAGS AND ROLLERS
[75] Inventor: Thaddeus F. Zlotek, Center Line, Mich.
[73] Assignee: Dana Corporation, Toledo, Ohio
[21] Appl. No.: 147,854
[22] Filed: Jan. 25, 1988
[51] Int. Cl.⁴ .............................................. F16D 41/07
[52] U.S. Cl. .................... 192/45; 192/41 R; 192/41 A; 192/45.1; 192/107 T
[58] Field of Search ............. 192/41 R, 41 A, 45, 192/107 T, 45.1

[56] References Cited
U.S. PATENT DOCUMENTS

| | | |
|---|---|---|
| 2,927,231 | 3/1960 | Bucek . |
| 2,946,708 | 7/1960 | Berghaus et al. . |
| 3,282,746 | 11/1963 | Zlotek et al. . |
| 3,536,602 | 10/1970 | Jones et al. . |
| 4,162,000 | 7/1979 | Zlotek ............................ 192/41 A |
| 4,194,930 | 3/1980 | Tamaka et al. . |
| 4,221,972 | 9/1980 | Oppel et al. . |
| 4,394,234 | 7/1983 | Asahi et al. . |
| 4,460,415 | 7/1984 | Korhonen et al. . |
| 4,712,661 | 12/1987 | Lederman et al. ................... 192/45 |
| 4,744,679 | 5/1988 | Verburg et al. .................... 384/523 |

OTHER PUBLICATIONS

"Planting Ions: Seeds for Precision-Tool Life Extension", John R. Colman, Tooling and Production, Dec. 1984, pp. 58–59.
"Tech Report–Ion Implantation", Thomas J. Drozda, Manufacturing Engineering, Jan. 1985, pp. 51–56.
"Ion Implantation of Surfaces", S. Thomas Pieraux and Paul S. Peercy, Scientific American, Mar. 1985, pp. 102–113.

Primary Examiner—Rodney H. Bonck
Attorney, Agent, or Firm—Marshall & Melhorn

[57] ABSTRACT

A linearly extending metallic element includes at least one relatively hard arcuate surface formed by ion implantation. The elements are utilized in an overrunning clutch and can be rollers or sprags. The clutch roller has the entire arcuate surface treated while the clutch sprag has only the opposed arcuate ends treated. In addition, tracks on the inner and outer races of a clutch can have relatively hard surfaces formed by ion implantation for contacting the rollers and the sprags.

17 Claims, 2 Drawing Sheets

SURFACE HARDENED SPRAGS AND ROLLERS

BACKGROUND OF THE INVENTION

The invention concerns wear resistant mechanical devices in general and, in particular, surface hardened sprags and rollers for overrunning clutches.

The most common form of wear in mechanical devices is adhesive and mild abrasive wear. There is a complex relationship between near surface structures and interaction between two faces in sliding contact. A magnified crosssection of a metal surface reveals myriad peaks (asperities) and valleys. Asperities will adhere to one another when faces are in sliding contact. Microscopic pieces of the less durable surface are plucked out (adhesive wear) which subsequently leads to more damaging abrasive wear. The dislodged particles work harden and combine with other hard particles to gouge the contacting surfaces.

Furthermore, there are small grains that form a lattice of different defects in the subsurface structure of the metal device. One defect that is especially troublesome is called a dislocation. As dislocations move under applied loads, surface microcracks are initiated that eventually propagate and aggravate particle loss.

Both coatings and heat treatments can easily improve wear resistance. Titanium-nitride coatings and hard chromium coatings, for example, resist wear better than most metal substrates. However, the applied thickness of material changes dimensions and can even delaminate in severe service. Heat treatments provide material hardness at an atomic level, so that delaminating is not a problem. The process temperatures, though, can distort precision parts.

Ion implanting, which takes place at room temperature, is a viable alternative where dimensionality and distortion are concerns. In one process, electrons emitted from a hot tungsten filament collide with nitrogen atoms and strip an electron to form an ion. The nitrogen ions are electrostatically extracted from the ion source and focused into a beam. The beam is accelerated to approximately 100 KeV and focused at the surface to be treated. The ions strike the surface and become embedded as a part of the surface. The embedded nitrogen ions act as atomic anchors by strongly coupling the structural defects such as dislocations. Injecting ions into a near-surface region induces compressive stresses (similar to the benefit of shot peening) that reduce the tendency of surface cracks to open. With tool steels, some nitrogen ions even bond with alloying elements (e.g., chromium or vanadium), forming extremely hard nitrides. These also protect the surface from fracturing. Further, certain oxide films eliminate severe adhesion and reduce the coefficient of friction. By modifying the composition of the uppermost layers of the object material, ion implanting reduces the chemical affinity of surfaces in contact, promotes normal oxide growth, and strengthens the metal oxide/metal interface, allowing a naturally formed surface oxide to serve as solid lubricant.

Although nitrogen ions penetrate less than one micron deep, during wear the implants debond and retreat from the wear front to form quasi-nitrides. This provides a persistence of wear resistance that is ten to fifty times deeper than the initially treated zone.

Ion implantation is considered a low temperature process. Because the atoms are implanted mechanically, there is no need for the application of high temperature to produce a thermal defusion of the atoms into the metal. The only heating that occurs is that due to the energetic atoms colliding with the atoms of the base material. The maximum temperature in the workpiece, which seldom exceeds four hundred degrees F., can be minimized by controlling the rate of implantation.

One mechanical device which typically requires a hardened surface for a use is a high carbon steel or steel alloy sprag or roller to be used as a wedging strut between concentric races of an overrunning clutch. Such devices were typically hardened by a chromizing or chromalizing treatment. It was found that the hardened surface could be improved by subjecting the device to a nitriding or carbonitriding heat treat operation prior to the chromizing treatment. In this process, the devices are thoroughly cleaned to eliminate all surface contamination and are heated in a furnace at 200° F. to 250° F. to drive off all moisture present. The devices are placed in baskets in a heat treating furnace and are heat treated in the presence of raw ammonia at a temperature in the general range of 1535° F.–1500° F., for a soaking time at temperature depending upon the desired body hardness characteristic of the steel. Quenching and further cooling follow under controlled conditions, and drawing to relieve stress.

SUMMARY OF THE INVENTION

The present invention concerns clutches having sprags and rollers with improved wear characteristics. Predetermined contact surfaces on the rollers and sprags are subjected to ion implantation to create a wear resistant surface without the dimensional changes and distortions associated with the prior art treatment methods. Typically, nitrogen ions are implanted in the surfaces of the rollers and sprags as a substitute for heat treat procedures utilizing relatively high temperatures. In addition, either or both of the tracks on the inner and outer races can be subjected to ion implantation.

DESCRIPTION OF THE PREFERRED EMBODIMENT

Figure 1:
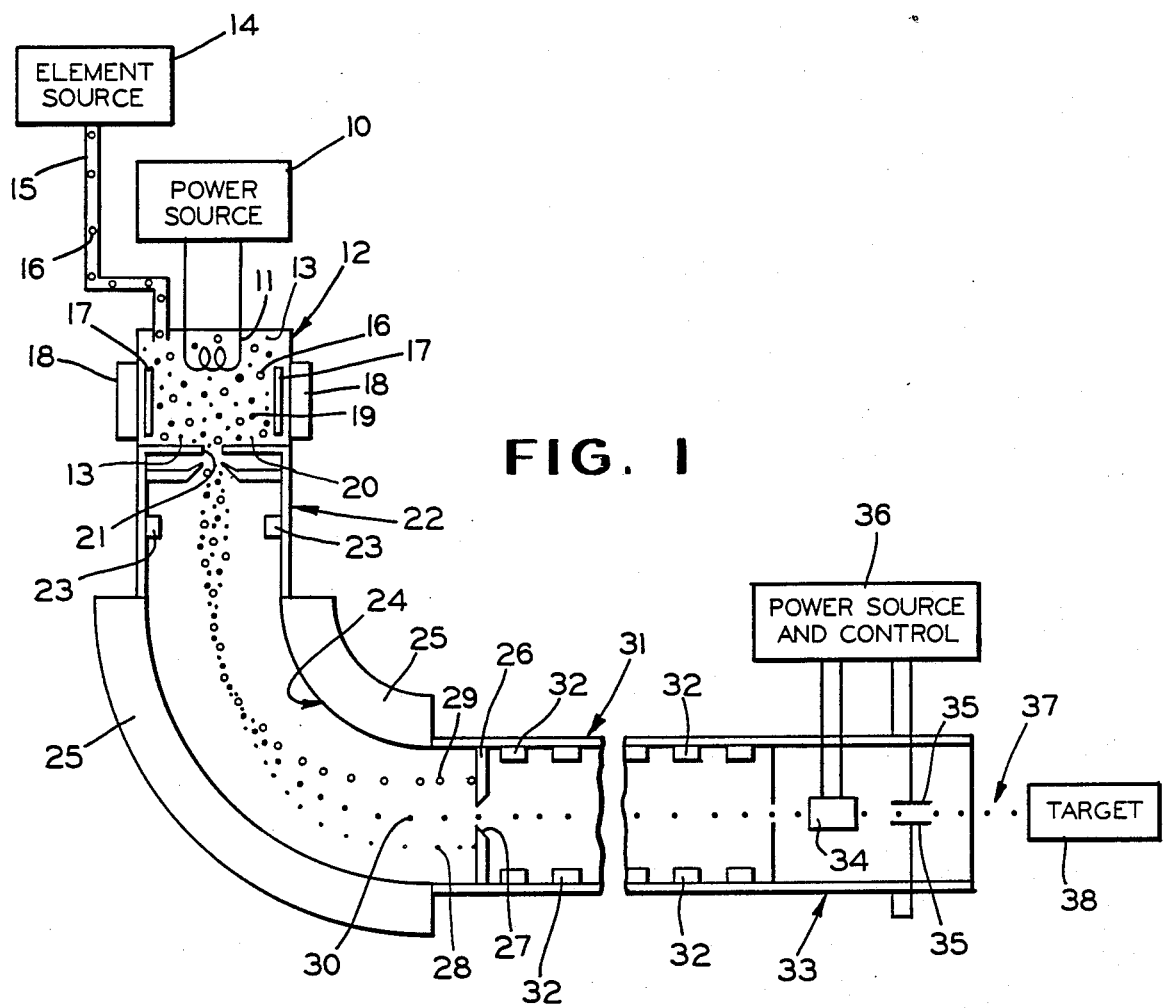
FIG. 1 is a schematic diagram of ion implanting equipment utilized to process rollers and sprags in accordance with the present invention.

There is shown in FIG. 1 a schematic representation of ion implantation system which generates a beam of ions focused on a target. A power source 10 is connected to a filament 11 which is positioned in an ionization chamber 12. The power source 10 heats the filament 11 to boil off electrons 13 into the chamber 12. An element such as nitrogen is provided from an element source 14 connected to the ionization chamber 12 by a conduit 15. The nitrogen is typically provided as a gas and atoms 16 of nitrogen flow through the conduit and into the ionization chamber 12. The electrons 13 are accelerated by an electric field generated by a pair of opposed anodes 17 positioned on opposite sides inside the chamber 12. A pair magnets 18 positioned on opposite sides of the chamber 12 outside the chamber walls create a magnetic field which also assists in the acceleration of the electrons 13. The high velocity electrons 13 collide with the nitrogen atoms 16 stripping away the nitrogen's own electrons thereby ionizing the gas to create a plasma. For example, an ion 19 of nitrogen is shown adjacent an associated striped-away electron 20.

An outlet 21 from the ionization chamber 12 is connected to an ion extraction zone 22. An electric field is generated by a pair of sources 23, such as electromagnets, on opposed side walls to draw the plasma from the ionization chamber 12.

It is desired to generate an ion beam of fairly high purity. Therefore, a curved tube section 24 is provided to deflect the desired ions to a precise angle. The deflection is accomplished by a magent 25 encircling the tube. Lighter ions are deflected further, out of the path of the beam. Heavier ions also stray from th beam and are deflected at smaller angles than the desired ions. At the end of the curved tube section 24, opposite the ion extraction zone 22, is a transversely extending wall 26 having a central opening 27 formed therein. A plurality of lighter ions 28 strike the wall to the right of the opening 27 and a plurality of heavier ions 29 strike the wall to the left of the opening 27. A plurality of the desired weight ions 30 form a beam through the opening 27 and into an ion acceleration tube 31.

A series of electric fields generated by opposed pairs of electromagnets 32 on the walls of the tube 31 focus and accelerate the purified ion beam to its final energy level sending it into an implantation chamber 33. Because the beam is relatively narrow, typically only a few centimeters in diameter, it must be swept across the surface of the target to implant the material evenly. Thus, a pair of generally parallel, horizontally displaced electrodes 34 are provided and cooperate with a pair of generally vertically spaced electrodes 35 to deflect the ion beam. The electrodes 34 and 35 are connected to a power source and control 36 which varies the power supply to each of the electrodes in order to deflect the ion beam. An ion beam 37 exits the implantation chamber 33 and impinges on a target 38.

As the ions enter the target material 38, they lose energy through collisions with electrons and nuclei and quickly come to rest. The most probable penetration depth, referred to as the projected range, can be calculated from the type and energy of the ions and the characteristics of the material. For typical ion beam energies of from ten to five hundred kiloelectron volts, projected ranges vary between ten and one thousand nanometers, depending on the type of ion and host material. Individual ions, of course, do not come to rest precisely at the projected range. Instead their depths fall into a distribution than can be represented as a bell curve centered on the projected range. The width of the curve, characterized by the standard deviation of the depth around the projected range, is known as the range spread.

It is possible to anticipate and therefore to control, not only the depth distribution of the implanted atoms, but also the change in composition they produce in the host material. The calculation takes into account the ion flux of the beam, the number of atoms per unit of volume in the target and the exposure time. For example, the composition of a one hundred nanometer thick surface region containing $5 \times 10^{22}$ atoms per cubic centimeter is to be altered by ten parts in a million. At an ion beam flux of $10^{14}$ ions per square centimeter per second, an exposure of a twentieth of a second per unit of area would suffice. A twenty percent change in composition would require about twenty minutes of exposure of every unit of area. To achieve a uniform distribution of implanted atoms throughout the thickness of the treated region, the energy of the ion beam can be varied so that the individual distribution curves add in a nearly constant distribution profile.

Figure 2:
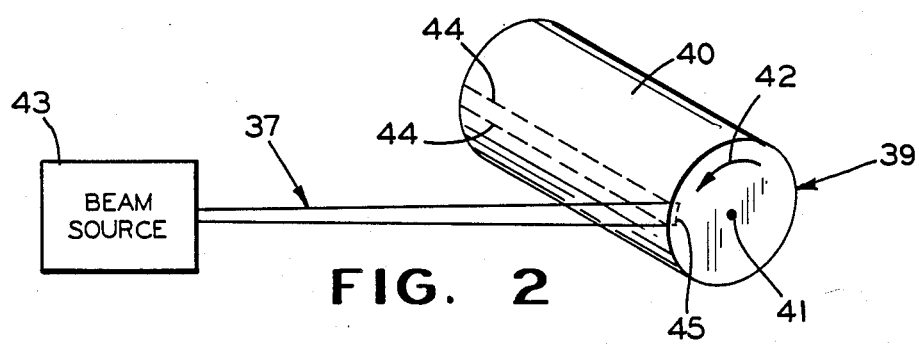
FIG. 2 is partial perspective and partial schematic view of a clutch roller being processed in accordance with the present invention.

There is shown in FIG. 2 a clutch roller 39 being subjected to an ion implantation process in accordance with the present invention. As utilized in a clutch, the roller 39 only requires that is cylindrical surface 40 be rendered more resistant to wear. Therefore, the roller 39 can be rotated about its longitudinal axis represented by a point 41 in the direction of an arrow 42 while the electron beam 37 generated from a beam source 43 is swept longitudinally across the cylindrical surface 40. The beam 37 is swept along a path defined by a pair of substantially parallel dashed lines 44 from one end of the roller 39 to its opposite end as the roller is rotated in order to uniformly implant ions in the cylindrical surface 40 to a depth designated by a dashed line 45.

Figure 3:
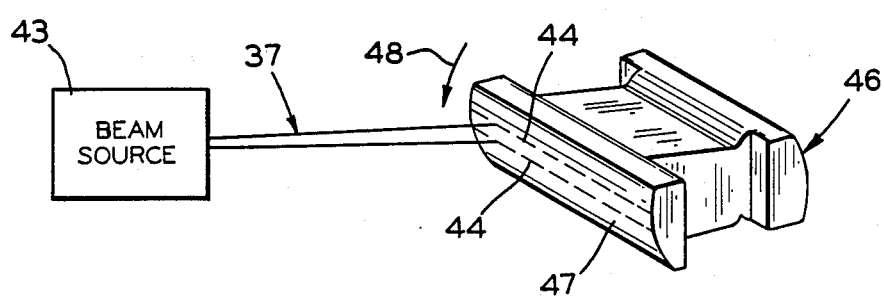
FIG. 3 is a partial perspective, partial schematic view of a clutch sprag being processed in accordance with the present invention.

There is shown in FIG. 3 a clutch sprag 46 being subjected to an ion implantation process in accordance with the present invention. The beam source 43 generates the ion beame 37 which can be swept along a path defined by the dashed lines 44. However, the sprag 46 can not be rotated about any single longitudinal axis since the irregular shape of its outer arcuate surface 47 will vary in distance from the beam source 43 thereby varying the distance between the lines 44 and the amount of ion implantation per square unit of surface area. This problem can be solved by either varying the strength of the ion beam 37 or by moving the sprag 46 to maintain a constant distance between the beam source 43 and the surface 47 as the sprag 46 is rotated in the direction of an arrow 48.

Figure 4:
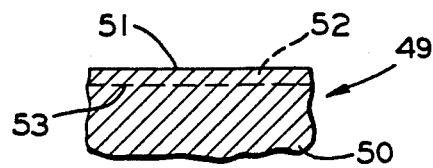
FIG. 4 is a fragmentary sectional view of the surface area of a device having been treated by ion implantation.

In FIG. 4, a metal device or element 49, such as the roller 39 or the sprag 46, is shown in fragmentary crossection. A body 50 of the device has an outer surface 51 which has been subjected to ion implantation. The ion implantation has occurred in a zone 52 extending inwardly from the outer surface 51 to a depth defined by a dashed boundary line 53. As stated above, the depth of the ion implantation zone 52 can be controlled to produce the desired wear characteristics for the device 49.

Figure 5:
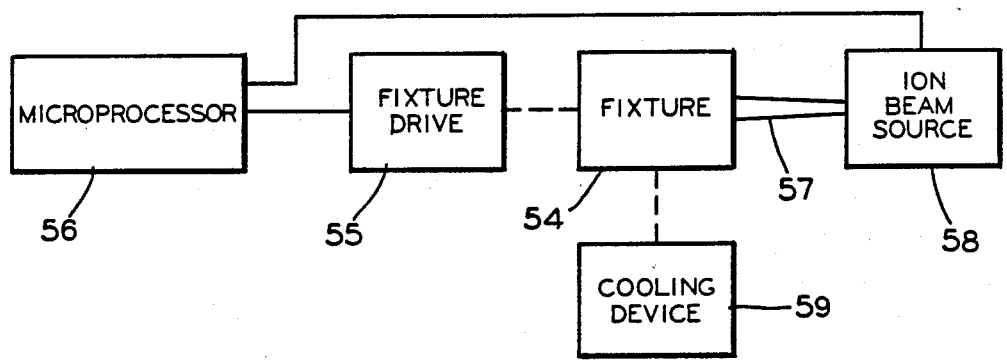
FIG. 5 is a block diagram of a control system for the apparatus shown in FIG. 1.

A commercial device for performing the ion implantation process is available from Zymet, Inc. of Danvers, Mass. as a model Z-100 ion implantation system. This system is represented in block diagram form in FIG. 5. A fixture 54 for holding the target device is mechanically coupled to a fixture drive 55. The fixture drive 55 is controlled from a microprocessor 56 which controls the orientation of the target device with respect to an ion beam 57 generated from an ion beam source 58. In addition, the microprocessor 56 is connected to the ion beam source 58 to control the strength and the sweep path of the ion beam 57. The system is also provided with a cooling device 59 which provides cooled water to the fixture 54 which in turn holds the target device in a water-cooled eutectic which conducts any heat generated during the ion implantation process away from the target device.

Figure 6:
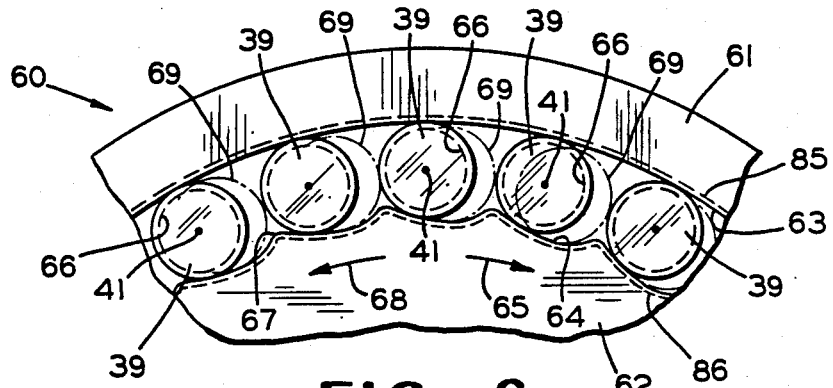
FIG. 6 is a fragmentary cross-sectional view of an overrunning clutch including rollers in accordance with the present invention.

There is shown FIG. 6 a fragmentary cross-sectional view of an overrunning clutch 60 incorporating rollers which have been subjected to ion implantation in accordance with the present invention. The clutch 60 includes an outer race 61 which can be formed as hollow cylinder. An inner race 62 can be formed as a cylinder mounted inside the outer race 61 and concentric therewith. An inner wall 63 of the outer race 61 and a facing outer wall 64 of the inner race 62 define an area for retaining a plurality of clutch rollers 39. The rollers 39 are spaced completely around the area defined between the walls 63 and 64.

When the inner race 62 is rotated in a clockwise direction with respect to the outer race 61, as indicated by an arrow 65, each of the rollers 39 rotates in a counterclockwise direction about its axis 41. The rollers 39 include an ion implantation relatively hard arcuate surface extending radially inwardly to a depth defined by a dashed line 66. The hard surface decreases wear as the rollers 39 fictionally engage the walls 63 and 64. The rotating rollers 39 tend to move from a smaller diameter area of the outer wall 64 to an area 67 of increased diameter formed on the outer wall 64. The areas 67 and the inner wall 63 cause the rollers 39 to wedge thereby locking all rollers against further rotation. The outer race 61 is now frictionally coupled to the inner race 62 and tends to rotate in the direction of the arrow 65.

When the relative rotation is in the opposite direction, as shown by an arrow 68, the rollers 39 are rotated in a clockwise direction about the axis 41 and move out of engagement with the area 67 to a position 69 shown in phantom. The clutch 60 is now unlocked or disengaged such that the outer race 61 can be held stationary or rotated in the direction of the arrow 65. Of course, either of the races 61 and 62 can be held stationary or both can be rotated such that the relative rotation is as has been described above.

Figure 7:
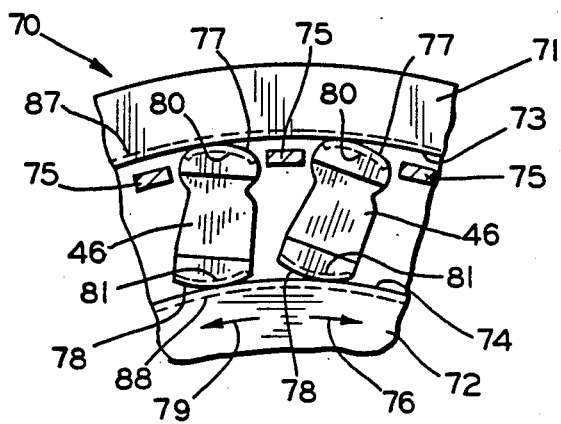
FIG. 7 is a fragmentary cross-sectional view of an overrunning clutch including sprags in accordance with the present invention.

Thus, the entire outer cylindrical surface of the rollers 39 is treated by ion implantation to a depth designated by the dashed line 66 since this area fictionally engages the walls 63 and 64 and the areas 67. However, only predetermined areas on the sprag 46 need to be treated with ion implantation since these areas are the only surfaces of the sprag 46 to fictionally engage the walls of an overrunning clutch. In FIG. 7 there is shown an overrunning sprag clutch 70 incorporating the sprags 46 which have been subjected to ion implantation. The clutch 70 includes an outer race 71 formed as a hollow cylinder and an inner race 72 formed as a cylinder mounted inside and concentric with the outer race 71. An inner wall 73 of the outer race 71 and an outer wall 74 of the inner race 72 define an area for retaining a plurality of clutch sprags 46. The sprags 46 are spaced around the inner race 72 and can be held in place by cross-bars 75 extending between a pair of cage rings (not shown) positioned at opposite ends of the races. Another means of positioning the sprags is a pair of annular garter springs (not shown).

If the inner race 72 is rotated in a clockwise direction with respect to the outer race 71, as designated by an arrow 76, the sprags 46 will tend to rotate about a longitudinal axis in a counterclockwise direction. Each of the sprags 46 has opposed arcuate end surfaces 77 and 78 which are defined by diameters larger than the distance between the walls 73 and 74. Thus, the sprags 46 wedge between the walls 73 and 74 and lock the outer race 71 into rotation with the inner race 72. Of course, rotation in the opposite direction designated by an arrow 79, releases the clutch 70. A portion of the arcuate end 77 designated by a dashed line 80 and a portion of the arcuate end 78 designated by a dashed line 81 are treated by ion implantation since these surfaces frictionally engage the walls 73 and 74 respectively.

In addition to treating the rollers 39 and the sprags 46, the track or area on the inner and outer races can be treated by ion implantation. In FIG. 6, a dashed line 85 designates an ion implantation surface on the wall 63 and a dashed line 86 designates an ion implantation surface on the wall 64. In FIG. 7, a dashed line 87 designates an ion implantation surface on the wall 73 and a dashed line 88 designates an ion implantation surface on the wall 74. As stated above, the ion implantation surface would typically coincide with the track for the rollers or the sprags.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. An overrunning clutch comprising:
    a first body of generally circular cross-section and having an inwardly facing arcuate first wall defined at a first diameter;
    a second body of generally circular cross-section positioned coaxially within said first body and having an outwardly facing arcuate second wall defined at a second diameter less than said first diameter;
    a plurality of elongate metallic elements disposed between said first and second walls, said elements each having at least one arcuate surface extending generally parallel to a longitudinal axis of said element and adapted to slidingly contact at least one of said first and second walls; and
    each of said metallic elements having a relatively hard surface area formed on at least a portion of said one arcuate surface by implantation of ions of a gaseous element accelerated toward said one arcuate surface, said ions being located throughout a zone extending from an outer surface of said relatively hard surface area inwardly to a predetermined depth.

2. The clutch according to claim 1 wherein said plurality of said metallic elements are of generally cylindrical cross-section and said relatively hard surface area extends only over the entire arcuate surface of each of said plurality of said metallic elements.

3. The clutch according to claim 2 wherein said elements are rollers.

4. The clutch according to claim 1 wherein said plurality of said metallic elements each have more than one arcuate surface adapted to slidingly engage said first and second walls.

5. The clutch according to claim 4 wherein said elements are sprags.

6. The clutch according to claim 5 wherein each of said elements has said relatively hard surface area formed on one of said arcuate surfaces bounded by a pair of arcuate surfaces free of said implanted ions.

7. The clutch according to claim 1 wherein said ions include nitrogen ions and said gaseous element includes nitrogen gas.

8. The clutch according to claim 1 wherein at least one of said first and second walls has a relatively hard surface formed by implantation of ions for contacting said relatively hard surface area on each of said metallic elements.

9. An overrunning clutch device, comprising:
   an outer race formed of a generally tubular body having an inwardly facing wall defined at a first predetermined diameter;
   an inner race formed of a generally cylindrical body positioned within said outer race and having an outwardly facing wall defined at a second predetermined diameter less than said first predetermined diameter;
   a plurality of elongate metallic elements positioned between said inwardly and outwardly facing walls; and
   a relatively hard surface area formed only on an arcuate surface of each of said elements by implantation of ions of a gaseous substance accelerated toward said arcuate surfaces, said arcuate surface extending generally parallel to a longitudinal axis of each of said elements and said ions being located throughout a zone extending from an outer surface of said relatively hard surface area inwardly to a predetermined depth.

10. The clutch device according to claim 9 wherein said elements are rollers and said relatively hard surface area on each of said rollers extends over the entire outer arcuate surface of each of said rollers and extends radially inwardly to said predetermined depth.

11. The clutch device according to claim 9 wherein said elements are sprags and said relatively hard surface area on each of said sprags extends over a portion of an arcuate surface formed at each opposed end of said sprag.

12. The clutch device according to claim 9 wherein each of said inwardly and outwardly facing walls has a relatively hard surface formed by implantation of ions for contacting said relatively hard surface area of each of said elements.

13. A metallic element for use in an overrunning clutch apparatus between an inner race and an outer race, comprising:
   an elongate metallic body having a longitudinal axis and at least one arcuate surface area extending generally parallel to said longitudinal axis; and
   a relatively hard surface area formed on at least a portion of said arcuate surface area by implantation of ions accelerated toward said portion of said arcuate surface areas, said ions being located throughout a zone extending from an outer surface of said relatively hard surface area inwardly to a predetermined depth.

14. The element according to claim 13 wherein said body is formed as a roller having a continuous arcuate surface and said relatively hard surface area extends over said continuous arcuate surface.

15. The element according to claim 13 wherein said body is formed as a sprag having a plurality of arcuate surface areas formed thereon including opposed arcuate end surfaces and said relatively hard surface extends over said arcuate end surfaces.

16. The element according to claim 15 wherein said relatively hard surface is bounded by at least one surface area free of said ion implantation.

17. The element according to claim 13 wherein said relatively hard surface area extends radially inwardly to said predetermined depth.

* * * * *